(12) United States Patent
Yu et al.

(10) Patent No.: US 7,714,414 B2
(45) Date of Patent: May 11, 2010

(54) METHOD AND APPARATUS FOR POLYMER DIELECTRIC SURFACE RECOVERY BY ION IMPLANTATION

(75) Inventors: Hsiu-Mei Yu, Hsin Chu (TW); Ken-Shen Chou, Hsin Chu (TW); Shun-Liang Hsu, Hsin Chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 1089 days.

(21) Appl. No.: 10/998,423

(22) Filed: Nov. 29, 2004

(65) Prior Publication Data

US 2006/0113640 A1  Jun. 1, 2006

(51) Int. Cl.
*H01L 23/58* (2006.01)

(52) U.S. Cl. ............... 257/635; 257/632; 257/E21.508; 257/E23.021

(58) Field of Classification Search .................. 438/705, 438/706, 710, 712, 719, 720, 723, 724, 725
See application file for complete search history.

(56) References Cited

U.S. PATENT DOCUMENTS

| | | | |
|---|---|---|---|
| 4,452,827 A * | 6/1984 | Kolev et al. ................. 427/525 |
| 4,913,762 A | 4/1990 | Kittler | |
| 5,543,493 A | 8/1996 | Park et al. | |
| 5,728,233 A | 3/1998 | Ikeda et al. | |
| 5,780,336 A * | 7/1998 | Son ............................. 438/251 |
| 5,876,453 A | 3/1999 | Beaty | |
| 5,900,443 A | 5/1999 | Stinnett et al. | |
| 6,006,763 A | 12/1999 | Mori et al. | |
| 6,200,888 B1 * | 3/2001 | Ito et al. ..................... 438/597 |
| 6,235,552 B1 * | 5/2001 | Kwon et al. ................ 438/106 |
| 6,479,391 B2 * | 11/2002 | Morrow et al. ............. 438/706 |
| 7,157,190 B2 * | 1/2007 | Ramstein ........................ 430/5 |
| 2003/0119297 A1 * | 6/2003 | Lam et al. ................... 438/612 |
| 2004/0166676 A1 * | 8/2004 | Kaji et al. ................... 438/687 |
| 2004/0245630 A1 * | 12/2004 | Huang et al. ................ 257/737 |
| 2004/0259336 A1 * | 12/2004 | Yeh et al. .................... 438/585 |
| 2005/0255709 A1 * | 11/2005 | Lee ............................. 438/780 |

FOREIGN PATENT DOCUMENTS

| KR | 2001038007 | * | 5/2001 |
|---|---|---|---|
| KR | 2001038007 A | * | 5/2001 |

* cited by examiner

*Primary Examiner*—Allan Olsen
(74) *Attorney, Agent, or Firm*—Duane Morris LLP

(57) ABSTRACT

In one embodiment, the disclosure relates to a method and apparatus for surface recovery of a polymer insulation layer through implantation. The method includes providing a substrate having thereon a conductive pad and an insulation layer, optionally processing the conductive pad to remove oxide layer formed on the conductive pad and conducting ion implantation to recover dielectric properties of the insulation layer.

28 Claims, 3 Drawing Sheets

METHOD AND APPARATUS FOR POLYMER DIELECTRIC SURFACE RECOVERY BY ION IMPLANTATION

BACKGROUND

Fabrication of microelectronics devices makes effective use of patterned microelectronics conductor layers employed as interconnections for signal and power propagation by separating such conductor layers by means of blanket and/or patterned dielectric layers. Advances in speed and performance requirements, along with decreases in dimensions have made the requirements placed upon such dielectric layers more stringent with respect to lowering the "relative dielectric constants" of the dielectric layers (i.e., the dielectric constants relative to vacuum). The "relative dielectric constant" of a dielectric layer is hereinafter referred to for brevity as the "dielectric constant" of the dielectric layer. Dielectric layers having a lower dielectric constant are typically disposed between and around patterned microelectronics conductor layers during the fabrication process. Such dielectric layers reduce parasitic capacitance and cross-talk.

Due to the availability of many kinds of polymers with such desirable properties as high elongation, low dielectric constant, low surface energy or critical surface tension, polymers are used with increasing frequency in VLSI processes. Such alternative low dielectric-constant layers may be formed over microelectronics substrates by, among others, spin coating deposition of intrinsically low dielectric constant materials such as organic polymer spin-on-polymer (SOP). Dielectric layers can exhibit somewhat lower dielectric constants which range from about 2-3. Organic polymers SOP materials include polyimide organic polymer SOP, poly (arylene ether) organic polymer SOP and fluorinated poly (arylene ether) organic polymer SOP. The above-mentioned dielectric materials require thermal curing to form stable dielectric layers from the spin-on-polymer (SOP) dielectric materials. Thermal curing can adversely affect the dielectric constant of the polymer.

The processing steps implemented during the VLSI fabrication can also deplete or degrade some of the very properties for which the polymer is used. For example, soft etching, RF soft etching or ion milling etching are typically used as pretreatment steps. The pretreatment steps can damage the dielectric properties as they can cause the release of surface organic atoms such as carbon, oxygen and nitrogen. For example, polyimide is a common dielectric insulation whose imide group readily decomposes by ion etching. By way of another example, ion milling is also destructive of the surface organic atoms of the polyimide material.

Conventional methods of recovering the properties of dielectric material include ozone treatment, nitrogen sputtering, vaporized fluid treatment, gas diffusion or wet treatment. However, the conventional methods are expensive, inefficient and inaccurate. Hence, there is a need for method and apparatus for polymer dielectric surface recovery.

SUMMARY OF THE DISCLOSURE

In one embodiment, the disclosure relates to a method for recovering the physical and chemical properties of a polymer layer, including its dielectric properties, by exposing the polymer layer to an ion implantation source capable of implanting a group of desired ions on the surface of the polymer. The polymer can be, among others, polyimide, polyimide-2 or divinyl siloxane-benzocyclobutene ("BCB").

According to another embodiment the disclosure relates to a method comprising providing a substrate having a conductive pad and a first insulation layer; depositing a seed layer to cover the conductive pad and a portion of the first insulation layer; depositing a redistribution layer to cover the seed layer; depositing a second insulation layer to cover the redistribution metal layer; and imparting at least one ion to the second insulation layer to recover physical and chemical properties of the second insulation layer.

According to another embodiment, the disclosure relates to a method for recovering dielectric properties of an insulation layer of a semiconductor device by providing a substrate having a conductive layer interposed between said substrate and a first insulation layer, the first insulation layer expositing at least a portion of the conductive layer; imparting at least one ion onto the first insulation layer to recover dielectric properties of the first insulation layer; depositing an intermediate layer to cover the metal pad and at least a portion of the first insulation layer; depositing a second insulation layer to cover the intermediate layer; and imparting at least one ion onto the second insulation layer to recover physical and chemical properties of the second insulation layer.

BRIEF DESCRIPTION OF THE DRAWINGS

The disclosure is described with reference to the following non-limiting and exemplary illustrations in which similar elements are numbered similarly and where.

DETAILED DESCRIPTION OF THE DISCLOSURE

Among semiconductor-processing techniques, ion implantation is unique in that process parameters, such as concentration and depth of the desired dopant can be specified directly in the equipment settings to deliver a desired implant dose and energy. Ion implantation is advantageous over the chemical vapor deposition and other conventional deposition methods since parameters such as film thickness and density can be more accurately controlled. Conventional ion implantation process is a method by which ions of a material can be implanted into another solid to change the physical attributes of the solid. Ion implantation can impart a chemical and a structural change in the target. A chemical change can be the result of introducing a different element than the target's own composition. The structural change occurs because the crystal structure of the target can be damaged or even destroyed.

A typical ion implantation equipment can include an ionization chamber, an accelerator and a target chamber. The ion ionization chamber is where ions of the desired element are produced. The accelerator is where the ions are electrostatically accelerated to a high energy. Finally, the target chamber is where the ions impinge on a target; the target being the material receiving the ions. Since each ion is usually a single atom, the actual amount (dose) of material implanted in the target is the sum of the ion current over time. Ion implanters can have small, medium or large supply currents. The small supply current is typically in microamperes range, resulting in a relatively small implanted dose. Such applications are particularly suitable for cases where the desired chemical change is small.

Ion energies are typically in a range of about 10 to 500 keV (1,600 to 80,000 aJ.) Energies in the range 1 to 10 keV (160 to 1,600 aJ) can result in a small depth of penetration (e.g., few nanometers or less.) Energies lower than this can result in very little damage to the target and are considered Ion Beam Deposition. At the other end of the spectrum, higher energies such as accelerators producing 5 MeV (800,000 aJ) may be used. However, such accelerators can result in structural damage to the target while providing a broad depth of distribution.

In solids, depth of ion penetration is a function of the energy of the ions, the ion species and the composition of the target. The average penetration depth is called the range of the ions. A conventional ion beam can have a wide depth distribution. Under typical circumstances ion ranges can be between 10 nm - 1 µm. This makes ion implantation particularly suitable for polymer dielectric surface recovery where the chemical or structural change is near or at the surface of the polymer. As ions penetrate and travel through the surface they gradually lose their energy. The energy loss, also knows as stopping, is caused by collision with target atoms and a mild drag from overlap of electron orbitals.

Figure 1A:
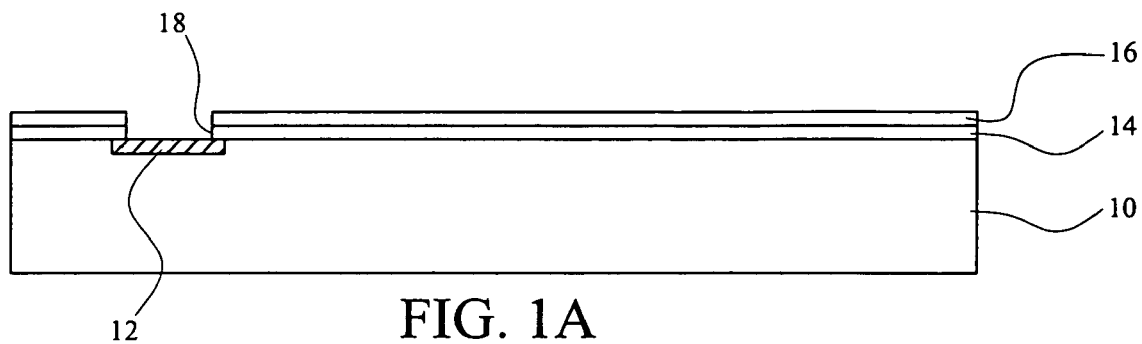
FIGS. 1A-1H schematically illustrate polymer dielectric surface recovery according to one embodiment of the disclosure.

FIGS. 1A-1H schematically illustrate polymer dielectric surface recovery according to one embodiment of the disclosure. Referring to FIG. 1A, a semiconductor wafer is shown as having substrate 10, passivation layer 14 and first insulation layer 16. Although shown in the embodiment of FIG. 1A, formation of Passivation layer 14 may be optional. First insulation layer 16 may be a polymer such as a polyimide or divinyl siloxane-benzocyolobutene. Passivation layer 14 may be formed by spin coating followed by pre-baking. Substrate 10 may include active or passive components formed therein (not shown) as well as other conductive layers or dielectric layers over the wafer surface. Pad layer 12 is interposed between substrate 10 and passivation layer 14. Pad 12 may be an I/O pad. Conventional fabrication processes can be used to expose a portion 18 of pad 12. Pad 12 can be configured to electrically connect to at least one device (not shown) within or on substrate 10.

Figure 1B:
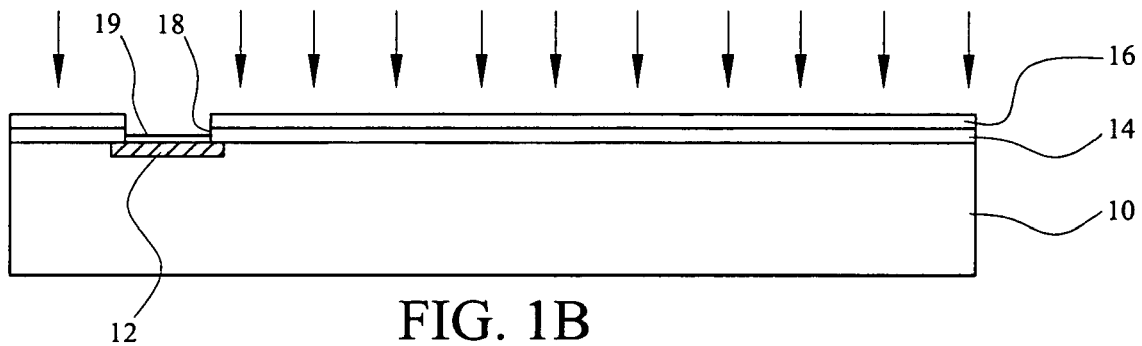

FIG. 1B shows the pretreatment of the first insulation layer. During fabrication an oxide layer forms over the exposed I/O pad 12. For example, ion milling and etching with hydrogen ($H_2$) or argon (Ar) can cause significant surface damage to pad 12. If pad 12 is made of copper, then the oxide layer would be copper oxide. Similarly, if the pad 12 is aluminum, then oxide layer 19 would be aluminum oxide. The oxide layer causes surface roughness on the surface of first insulation layer 16. The roughness increases adhesion of the surface by increasing surface tension. Therefore, the structure including the first polyimide layer is pretreated 20 to remove oxide layer 19. In one embodiment, the structure is pretreated by ICP soft etching, RF soft etching or ion milling etching to remove the oxide layer 19 from I/O pad 12. The pretreatment step can remove C, N and O atoms from the surface of insulation layer 16. Ion milling etching with $H_2$ and Ar particularly damages the physical and chemical properties of a polyimide insulating layer. As a result first insulation layer (the first polyimide surface) loses C, N, O and other ions from its surface. A measurement of the dielectric constant of first insulation layer 16 before ion milling etching showed a dielectric constant greater than 10 GF. After the ion milling etching step, the value of the dielectric constant dropped to about 10 KF.

Figure 1C:
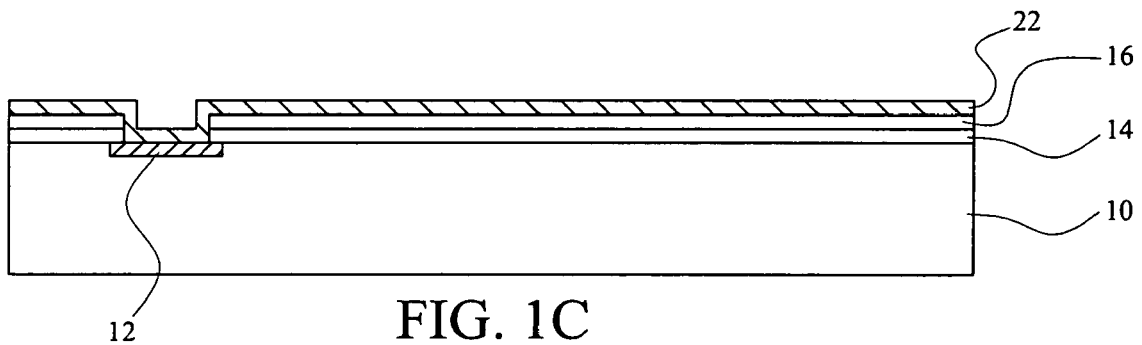

In FIG. 1C, under-bump metallurgy (UBM) seed layer 22 is deposited to cover first insulation layer 16 and pad 12. The seed layer deposition step may be used for the epitaxial growth of a new layer. Exemplary compositions for the seed layer 22 include titanium, copper, nickel and chromium. Seed layer 22 may also comprise a combination of two or more components such as Ti/Cu/Ni or Ti/Cu. In one embodiment of the disclosure seed layer 20 can be deposited by sputtering.

Figure 1D:
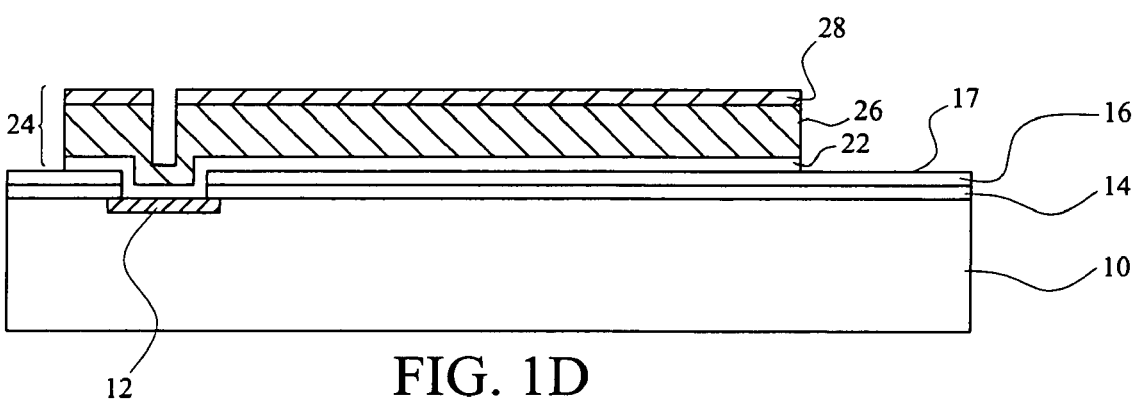

Referring to FIG. 1D, layers 26 and 28 are deposited over layer 22. Layers 26 and 28 can define a re-distribution metal layer 24 having a lower trace metal layer 26 and an upper trace metal layer 28. The lower layer 26 may comprise nickel while and the upper layer may comprise copper.

Figure 1E:
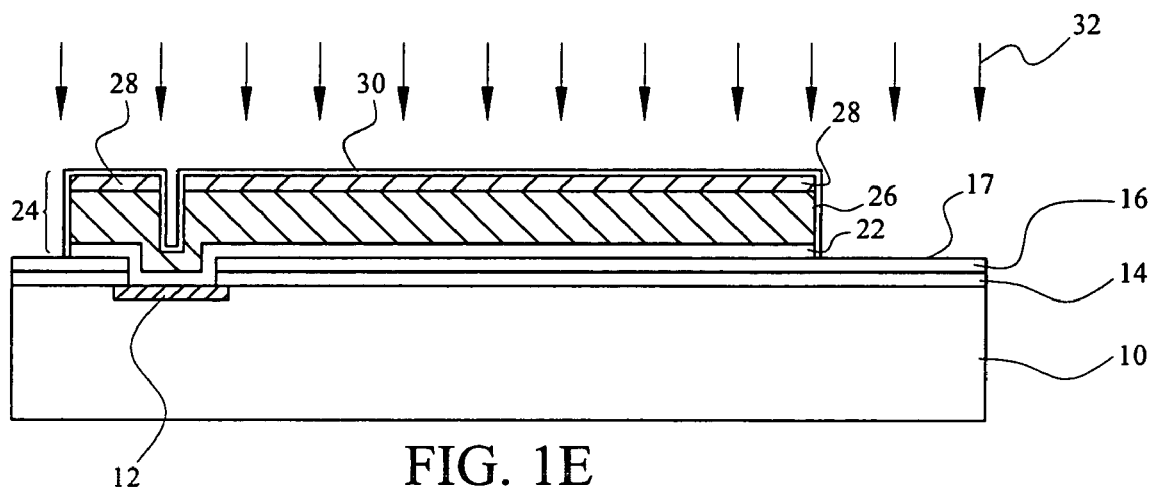

As shown in FIG. 1E, during the UMB seed metal layer 22 etch-back a thin oxide layer 30 forms on the surface of the trace metal layer 24. According to an embodiment of the disclosure, a first ion implantation step 32 can be performed to restore the dielectric properties of first insulation surface 16. The oxide layer 30 can serve as a first ion implantation mask. The ion implantation can include C, N and O. According to another embodiment of the disclosure, a first ion implantation step is implemented with a first ion (e.g., nitrogen) followed by a second ion implantation step (e.g., oxygen). Using ion implantation the dosage and depth of penetration can be closely controlled. The ion implantation step enables recovery of the polyimide layer's dielectric constant from about 10 KF to about 10 GF. In one embodiment, the power range is about 80-120Kev and the dosage range is about 1.5E12-2.5E12 ions/$cm^2$.

Figure 1F:
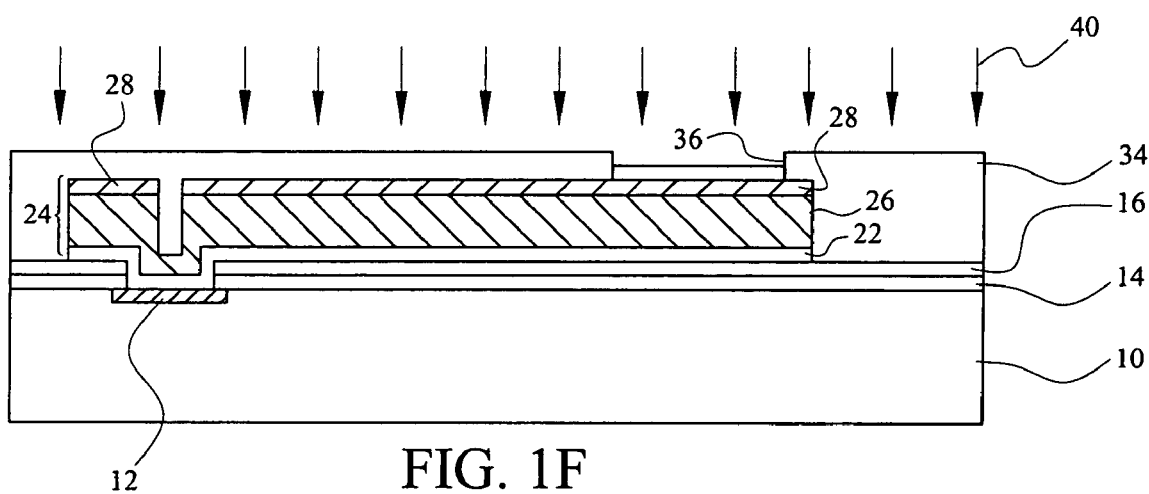

Having recovered the physical properties of first insulation layer 16 as shown in FIG. 1E, a second polyimide layer 34 can be formed over the structure shown in FIG. 1F. Second polyimide layer 34 extends over a substantial surface of the wafer. Optionally, oxide layer 30 may be removed prior to depositing the second insulation layer. The second polyimide layer 34 can be formed with parameters analogous to the formation of the first insulation layer 16. Selective etching can be implemented to expose a portion of the oxide layer 36. The thickness of second polyimide layer can be adjusted according to the desired application. In one embodiment, the second polyimide layer has a thickness in the range of about 3-8 µm. In another embodiment, the second polyimide layer has a thickness of about 5 µm.

An oxide layer (not shown) may form over the exposed upper metal layer 28. Thus, if upper metal layer 28 is comprised of nickel, for example, a nickel oxide layer may form. The newly-formed oxide layer must be removed to improve the electrical connection between metal layer 28 and other components of the device. The structure may be subjected to a second pretreatment step 40 to remove the oxide layer from the exposed surface. The second pretreatment may include ICP soft etching, RF soft etching or ion milling etching with Ar and $H_2$. The second pretreatment will affect second polyimide layer 34 damaging the polyimide layer as discussed above.

Figure 1G:
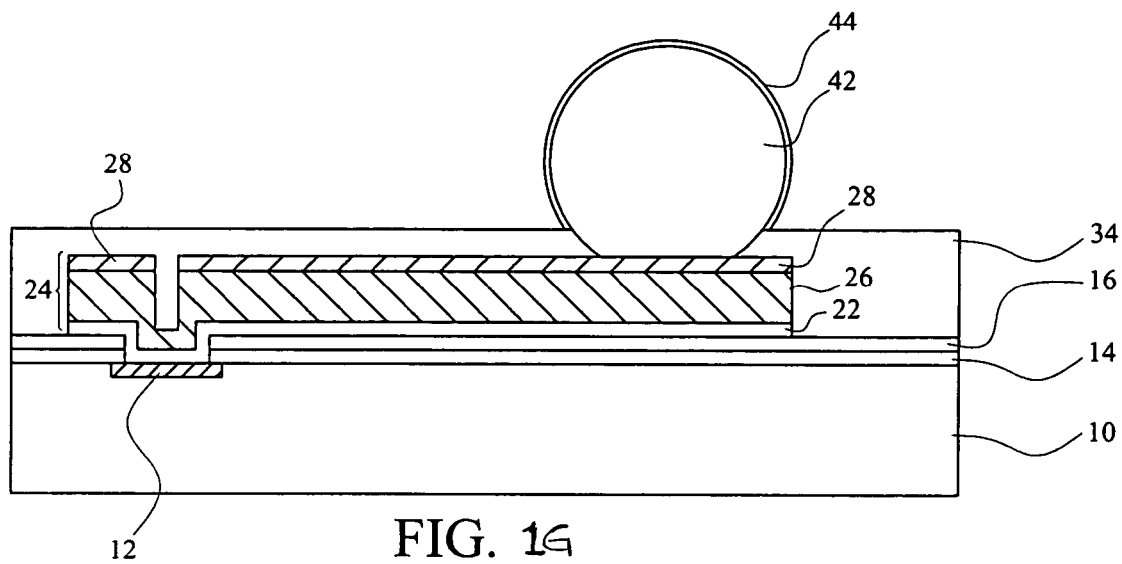

Using the exposed portion of oxide layer 36, solder ball 42 can be formed as shown in FIG. 1G. This step may be preceded by ion milling with Argon and hydrogen to etch the metal oxide layer. Thereafter, solder ball 28 can be formed by electroplating, ball mounting, printing, evaporation or other methods. In one embodiment, the structure may also be subjected to pre-bake or pre-flow (partial reflow) processes which can form an oxide layer 44 over the surface of the ball. In one embodiment of the disclosure, the oxide layer is about 400 Å thick. The metal oxide layer is particularly suited to act as both a protection film and an adhesion layer for adhering the solder ball to layer 26.

Figure 1H:
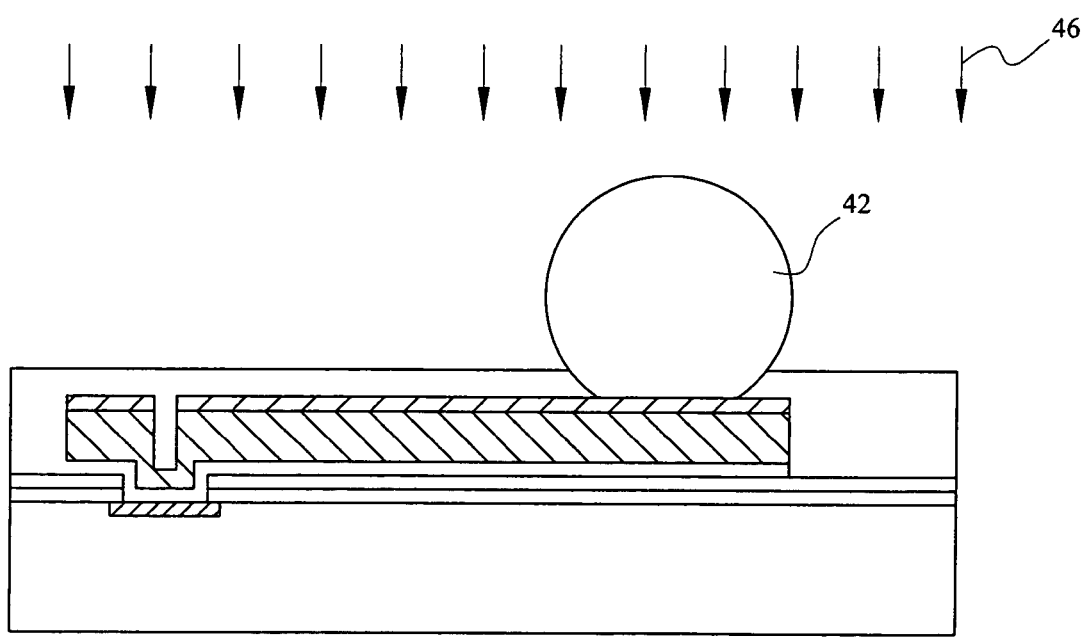

Referring to FIG. 1H, a second ion implantation 46 can be performed. The second ion implantation is directed predominantly at recovering the dielectric properties of the second polyimide dielectric surface 26. While any of the aforementioned organic compounds may be used for ion implantation, in one exemplary embodiment implantation is performed with nitrogen. It should be noted that C, N or O may also be used to replenish the lost atoms depleted from the second polyimide roughened surface during the pretreatment steps discussed above. The oxide layer discussed in relation with FIG. 1G can act as a mask to prevent ion implantation into solder bar 28.

According to one embodiment of the disclosure, about $1\times10^{12}$-$3.5\times10^{12}$ can be implanted at a depth of about 500-2000 Å on the second polyimide surface 26. In another embodiment of the disclosure about $1.5\times10^{12}$-$2.5\times10^{12}$ may be implanted. The depth can be in the range of about 800-1200 Å. A similar process can be performed to implant C and O atoms onto the surface of the second polyimide layer.

Once the second polyimide layer has recovered its desired properties, the oxide layer 44 on solder ball 28 may be removed. In one embodiment, the oxide layer is removed by a flux cleaning process. During this process a flux coating is first formed, followed by a reflow step and a flux cleaning step.

While Applicant's novel disclosure has been described in relation to certain exemplary embodiments presented herein, it should be noted that the principles of the disclosure are not limited thereto and include any modification, permutation or variation to the principles disclosed herein.

What is claimed is:

1. A semiconductor fabrication process for recovering physical and chemical properties of an insulator layer, the process comprising:
    providing a substrate having a conductive pad and a first insulation layer thereover;
    depositing a seed layer to cover the conductive pad and a portion of the first insulation layer;
    depositing a redistribution layer to cover the seed layer;
    depositing a second insulation layer with inherent physical and chemical properties as deposited, over and covering the redistribution layer;
    performing at least one processing operation that damages the inherent physical and chemical properties; and
    imparting at least one ion into the second insulation layer to recover the inherent physical and chemical properties of the second insulation layer.

2. The process of claim 1, wherein the at least one processing operation comprises pretreating the second insulating layer using at least one of ICP soft etching, RF soft etching, and ion milling etching with Ar and $H_2$.

3. The process of claim 1, wherein the seed layer is a metal seed layer.

4. The process of claim 1, wherein the inherent physical and chemical properties include a dielectric constant of the second insulation layer.

5. The process of claim 1, wherein the step of imparting at least one ion into the second insulation layer further comprises ion implantation.

6. The process of claim 1, wherein the at least one ion is selected from the group consisting of C, H, O and N.

7. The process of claim 1, further comprising the steps of forming an oxide film to cover the redistribution layer and imparting at least one ion to the first insulation layer prior to depositing the second insulation layer.

8. The process of claim 1, wherein the step of depositing the redistribution layer further comprises depositing a lower trace metal layer and an upper trace metal layer, the lower trace metal being one of nickel and copper.

9. The process of claim 8, wherein the redistribution layer is about 1-7 µm thick.

10. The process of claim 1, further comprising treating the conductive pad and the first insulation layer prior to the depositing a seed layer, wherein the treating damages the inherent dielectric properties of the first insulation layer; and imparting at least one ion to the first insulation layer, the imparting restoring the inherent dielectric properties of the first insulation layer.

11. The process of claim 10, wherein the step of imparting at least one ion to the first insulation layer further comprises ion implantation.

12. The process of claim 10, wherein the imparting at least one ion to the first insulation layer comprises mparting at least one of C, H, O and N.

13. A method for recovering dielectric properties of an insulation layer of a semiconductor device comprising:
    providing a substrate having a conductive layer interposed between the substrate and a first insulation layer, the first insulation layer exposing a portion of the conductive layer and including first dielectric properties;
    performing at least one first processing operation that damages the first dielectric properties;
    imparting at least one ion onto the first insulation layer to recover the first dielectric properties of the first insulation layer;
    depositing an intermediate layer to cover the exposed portion of the conductive layer and at least a portion of the first insulation layer;
    depositing a second insulation layer having second dielectric properties to cover the intermediate layer; and
    performing at least one second processing operation that damages the second dielectric properties;
    imparting at least one ion into the second insulation layer to recover the second dielectric properties of the second insulation layer.

14. The method of claim 13, wherein the performing at least one first processing operation comprises pretreating the conductive layer to remove an oxide layer formed on the conductive layer prior to the step of imparting at least one ion onto the first insulation layer.

15. The method of claim 13, wherein at least one of the first or the second insulation layer further comprises a polymer.

16. The method of claim 13, wherein at least one of the first or the second insulation layer is polyamide.

17. The method of claim 13, wherein the step of imparting at least one ion into the first or the second insulation layer comprises ion implantation.

18. The method of claim 13, wherein the imparting at least one ion into the second insulation layer comprises imparting at least one of C, H, O and N.

19. The method of claim 13, further comprising depositing a redistribution layer to cover the intermediate layer.

20. The method of claim 19, wherein the redistribution layer further comprises an upper and a lower metallic layers.

21. In a fabrication process for a substrate having a polymer layer and a conductive layer formed thereover, the conductive layer electrically communicating with a device in said substrate and the polymer layer having dielectric properties eroded during a fabrication step, a method for recovering the dielectric properties of the polymer layer comprising exposing the polymer layer to an ion implantation source to implant primary ions into the polymer layer to substantially recover the polymer layer's dielectric properties.

22. The method of claim 21, wherein the primary ions are selected from a group consisting of carbon, nitrogen and oxygen.

23. The method of claim 21, wherein the polymer is polyimide.

24. The method of claim 21, wherein the polymer is divinyl siloxane-benzocyclobutane.

25. The method of claim 21, wherein the fabrication step is etching.

26. The method of claim 21, further comprising exposing the polymer layer to the ion implantation source to implant secondary ions into the polymer.

27. The method of claim 26, wherein the secondary ions are selected from a group consisting of carbon, nitrogen and oxygen.

28. The method of claim 27, wherein the primary ions are nitrogen and the secondary ions are carbon.

* * * * *